United States Patent [19]

Zylstra et al.

[11] Patent Number: 5,019,936

[45] Date of Patent: May 28, 1991

[54] VOLTAGE-TO-FREQUENCY SQUARED CIRCUIT

[75] Inventors: Henry J. Zylstra, Alburnett; Steven J. Flock, Cedar Rapids, both of Iowa

[73] Assignee: Square D Company, Palatine, Ill.

[21] Appl. No.: 331,926

[22] Filed: Mar. 31, 1989

[51] Int. Cl.[5] .............................................. H02H 3/26
[52] U.S. Cl. ..................................... 361/93; 307/271; 361/86; 361/88
[58] Field of Search ....................... 361/86, 88, 93, 94; 307/570, 271; 328/128, 127

[56] References Cited

U.S. PATENT DOCUMENTS

| | | | |
|---|---|---|---|
| 4,005,283 | 1/1977 | Rhodes | 307/271 |
| 4,259,706 | 3/1981 | Zocholl | 361/93 |
| 4,513,342 | 4/1985 | Rocha | 361/96 X |
| 4,782,422 | 11/1988 | Jones et al. | 361/93 |

Primary Examiner—Todd E. Deboer
Attorney, Agent, or Firm—Jose W. Jimenez; Robert J. Crawford

[57] ABSTRACT

A voltage-to-frequency converter is provided for generating a frequency which is proportional to the square of the input voltage provided to the converter. Since the input voltage is correlative to current flowing in a conductor, the output frequency exhibits a proportionality similar to the relationship between the temperature of the conductor and the current flowing in it. The arrangement includes two charging circuits which receive the input voltage and are alternately charged as a function of the input voltage. While the first charging circuit charges to a predetermined voltage, the second charging circuit discharges. Upon exceeding the predetermined voltage, the output of a flip flop is set to discharge the first charging circuit, and to charge the second charging circuit. When the second charging circuit charges to a predetermined voltage, the output of the flip flop is reset, so that the first charging circuit charges again. As the input voltage rises, the charging time for each circuit decreases, thus causing the output of the flip flop to switch at a higher frequency. In effect, the frequency of the output of the flip flop changes at a rate proportional to the square of the input voltage.

25 Claims, 4 Drawing Sheets

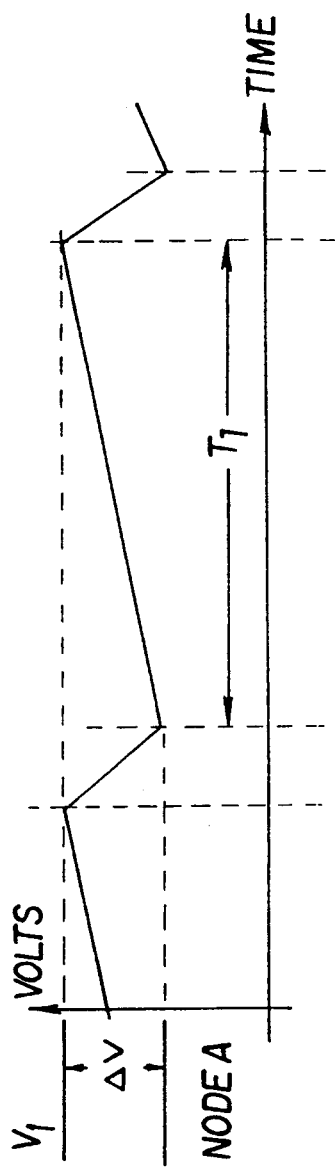
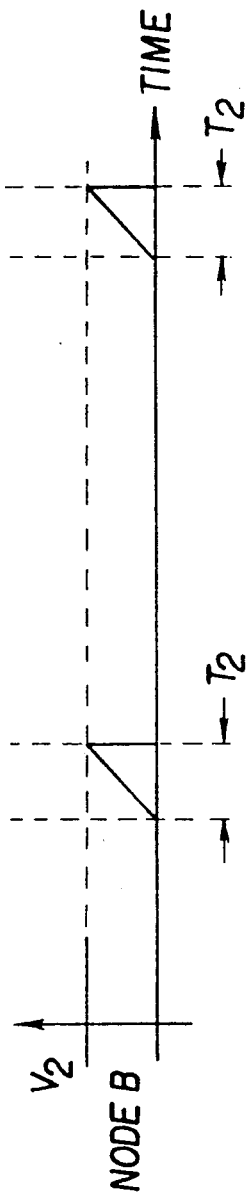
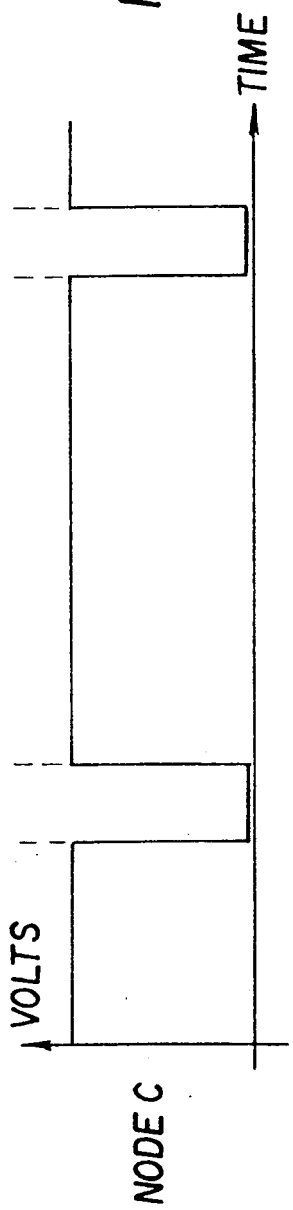

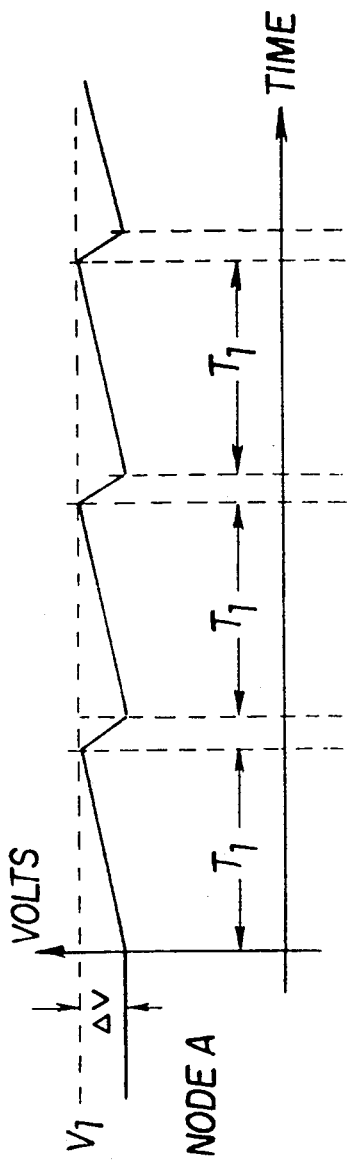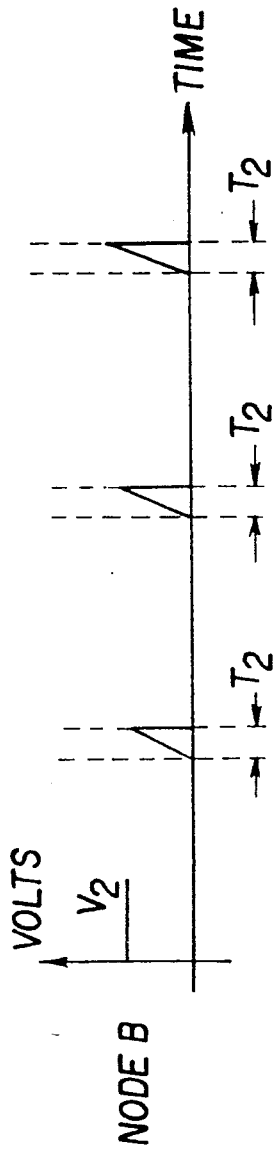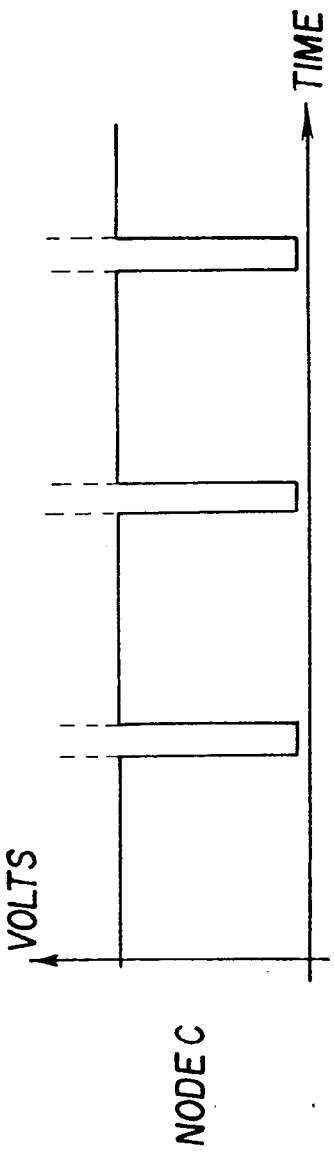

VOLTAGE-TO-FREQUENCY SQUARED CIRCUIT

REFERENCE TO CO-PENDING APPLICATIONS

This application was filed simultaneously with Ser. No. 331,473, entitled "Fault-Powered Power Supply" having the same inventive entities as the present application.

BACKGROUND OF THE INVENTION

1. Field of the Invention

This invention relates generally to voltage-to-frequency converters, and more particularly to voltage-to-frequency converters used as a timing delay device in circuit breakers.

2. Description of the Related Art

In the field of power distribution systems, circuit breakers are commonly used to protect the line conductors and any peripheral circuitry being powered thereby. Since every electronic or electrical component has a finite dissipation capability, the components tend to heat during use. Most components have a maximum power rating or a maximum temperature rating which should not be exceeded for proper operation. While most electronic components are protected from damaging currents and temperatures by surge protectors, clamping devices, heat sinks, and the like, electrical components, such as power distribution lines and motor windings, are protected by fuses and relays. Circuit breakers, in particular, typically include an electromagnetic relay in series with the line conductor. The relay serves two basic functions: (1) to carry the current in the line, and (2) to interrupt current in the line during a fault.

While prolonged exposure to an overcurrent condition will damage a power line, a limited overcurrent condition is allowable as long as the maximum temperature rating for the power line is not exceeded. Limited overcurrent situations regularly occur in most power distribution systems as part of the normal operation of such systems. For instance, an electric motor, which is started under load, draws a high current which could easily temporarily overshoot the maximum continuous current rating of its power line. It is not desirable for a protective device to respond quickly to every overcurrent condition, since the condition may be of such short duration that no harm to the system will occur. Therefore, a protective device, in order to be effective, must allow a certain amount of overload, so that unnecessary interruptions do not hamper the power distribution system.

It is desirable that a protective device respond more quickly to faults of a greater magnitude than to faults of a lesser magnitude. In this regard, it is well known in the art of power distribution system protection that the temperature of a conductor is proportional to the square of the current flowing through the conductor. Accordingly, the temperature of the power line can be determined by monitoring the current in the power line. In overcurrent situations, the relay operating time varies inversely with the square of the overload current, and is often referred to as the $I^2t$ characteristic. By controlling the relay in accordance with the magnitude of the overcurrent on the line, a large fault, such as that occurring when the power line is short circuited, produces a short relay response time. The circuit breaker interrupts the flow of current in the line in a short period of time to prevent damage to the power line. Conversely, a prolonged fault of a lesser magnitude, such as that occurring when an excessive number of devices is being powered by a line, produces a longer relay response time. Since the power line is heated at a slower rate by the lesser overload, it can safely function for a longer period of time before the circuit breaker interrupts current flow in the line.

A number of overcurrent protection devices have attempted to take advantage of the relationship between response time and line current with varying degrees of success and complexity. The key to obtaining an accurate circuit is finding a quantity which varies with the square of the current in the power distribution line. Many attempts have been made to provide this function by means of a "timing capacitor". In such cases, a d.c. voltage signal derived from the protected power line charges a timing capacitor. When the capacitor charges to a predetermined level, a tripping signal is delivered to energize an associated relay in order to open circuit the effected power line. The time that it takes for the capacitor to charge to the predetermined level is determined by the magnitude of the charging signal. The magnitude of the charging signal increases as the current on the line increases, so that larger currents cause the capacitor to charge faster to the predetermined level. However, a d.c. voltage signal which is directly proportional to the current on the line does not charge the capacitor at a rate related to the square of the current, and, therefore, does not yield a time delay that is proportional to the square of the current.

Attempts to overcome this drawback have included pulsating the d.c. voltage to the timing capacitor in the form of a pulse-width-modulated signal, the period of which is controlled by the current waveform. While this technique enabled a smaller capacitor to be used without sacrificing delay times, the required proportionality of the time delay to the current was still much less than accurate. Another inherent disadvantage of delay systems which utilize timing capacitors is the wide variation in manufacturing tolerances of capacitors. Although advances continue to be made toward perfecting timing capacitor circuits, as evidenced by U.S. Pat. Nos. 4,027,203, 4,115,829, and 4,386,384 issued to Moran et al., Howell, and Moran, respectively, the complexity of such circuits is disadvantageous.

Another delay device for an overcurrent protection system is disclosed in U.S. Pat. No. 4,513,342 issued Apr. 23, 1985 to Rocha. As shown therein, a piezoelectric sensing element provides a signal responsive to the square of the current in a power line. A buffering amplifier passes the signal to a filter which removes d.c. signal components, and then to a rectifying circuit which produces a full-wave rectified signal. Further signal conditioning produces a d.c. voltage signal which is proportional to the square of the current in the power line. This d.c. signal is fed into an integrator biased with a signal designating the maximum current rating of the power line. When the d.c. signal becomes greater than the biasing signal on the integrator, a capacitor in the integrator circuit begins to charge. If the d.c. signal charges the capacitor to a voltage which exceeds a tripping setpoint on an associated comparator, the comparator outputs a tripping signal to energize an electromagnetic relay for interrupting current flow in the power line. While the time delay on this device more closely approximates the $I^2t$ characteristic, it is subject to the usual problems associated with timing capacitors.

Also, the output signal, which is proportional to the square of the current, is not conducive to digital circuit breaker systems. Moreover, the use of a square-law current sensor is required, which increases the cost and complexity of the delay determination device.

The present invention is directed to overcoming one or more of the problems set forth above.

SUMMARY OF THE INVENTION

It is the primary object of the present invention to provide a device which provides an output signal that is proportional to the square of current flowing in a conductor.

It is an important object of the present invention to provide a device in accordance with the primary objective which demonstrates improved accuracy for timing and delay determination in circuit breaker applications.

It is another object of the present invention to provide a device in accordance with the above objectives which uses inexpensive components.

It is yet another object of the present invention to provide a device in accordance with the primary objective which outputs a signal having a frequency that varies in proportion to the square of current flowing in a conductor.

It is still another object of the present invention to provide a device in accordance with the primary objective which outputs a signal that can readily be processed by digital circuitry.

These and other objects are realized, in accordance with the present invention, by means of a voltage-to-frequency converter which generates a frequency signal which changes correlative to the square of the current on the power line. The voltage-to-frequency converter is used in a circuit interrupter which protects a conductor from excessive current. A signal correlative to the current flowing in the conductor is produced, and a frequency signal correlative to the square of the magnitude of the produced signal is delivered. The current in the conductor is preferably sensed by a current transformer, and the resulting signal is processed to produce a frequency signal. As the current in the conductor rises, the frequency of the frequency signal rises in proportion to the square of the magnitude of the current signal.

In accordance with a further aspect of the present invention, there is provided a system for protecting an electrical conductor from excessive current which interrupts current flowing in the power line. The current flowing in the conductor is sensed, and a signal correlative thereto is delivered. A frequency signal having a frequency correlative to the square of the magnitude of the current signal is delivered. The individual pulses of the frequency signal are counted, and a tripping signal is delivered in response to the count exceeding a predetermined count. The current flowing in the conductor is interrupted in response to the tripping signal.

BRIEF DESCRIPTION OF THE DRAWINGS

Other objects and advantages of the invention will become apparent upon reading the following detailed description and upon reference to the drawings in which:

FIG. 2A-2C illustrates waveforms at a first input voltage level;

FIG. 3A-3C illustrates waveforms at a second input voltage level; and

Figure 1:
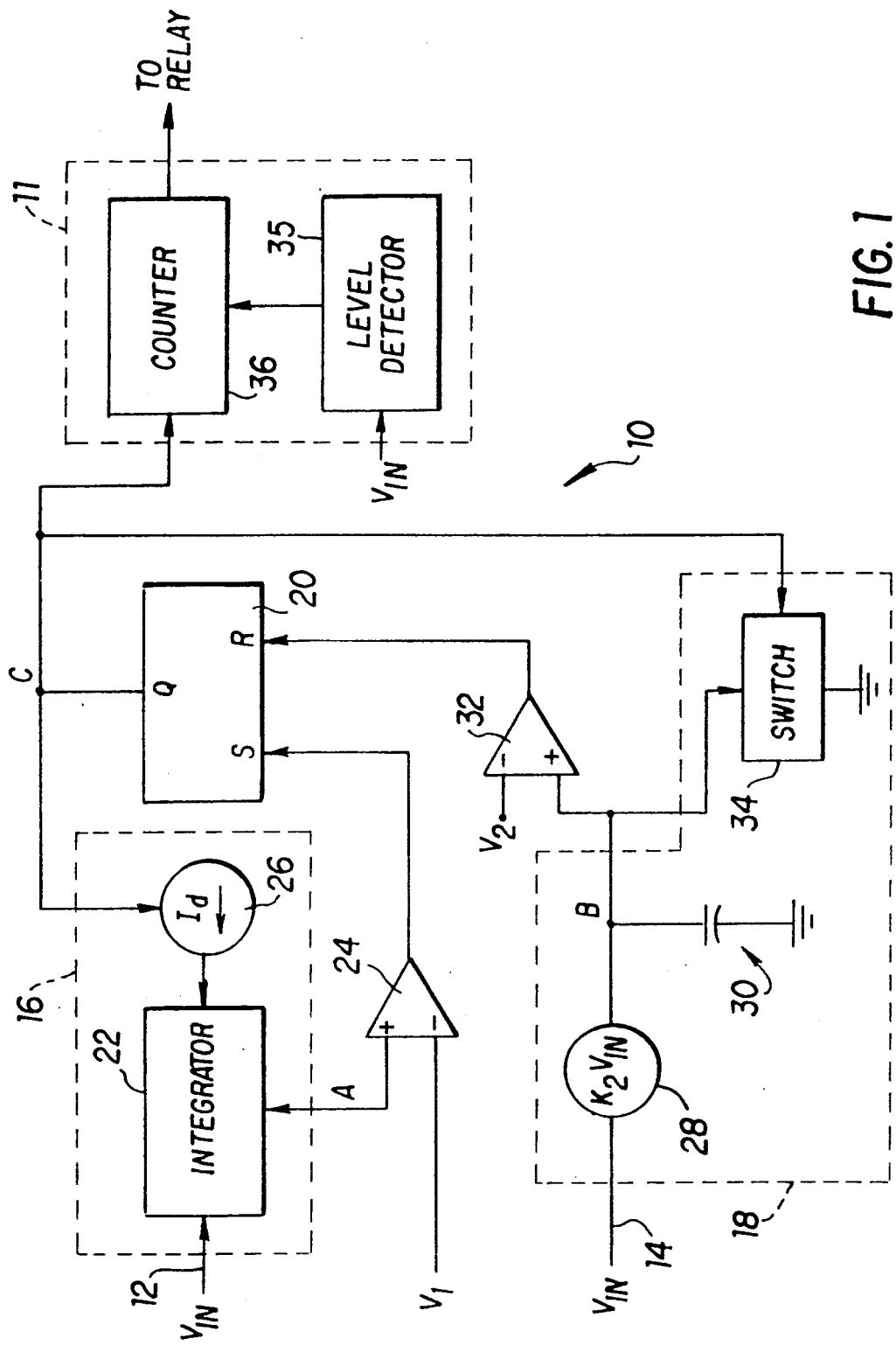
FIG. 1 is a functional block diagram of a voltage-to-frequency converter in accordance with the present invention.

While the invention is susceptible to various modifications and alternative forms, specific embodiments thereof have been shown by way of example in the drawings and will be described in detail herein. It should be understood, however, that it is not intended to limit the invention to the particular forms disclosed, but on the contrary, the intention is to cover all modifications, equivalents, and alternatives falling within the spirit and scope of the invention as defined by the appended claims.

DESCRIPTION OF THE PREFERRED EMBODIMENT

Turning now to the drawings, and referring initially to FIGS. 1-3, a voltage-to-frequency converter is generally designated by reference numeral 10. FIGS. 2 and 3 illustrate voltage waveforms taken at nodes A, B and C, respectively, at two different input voltage levels.

In the overall operation of a power distribution system, circuit breakers are typically used to protect the power lines which service each circuit. The power lines in each circuit are designed and rated to safely transmit a predetermined amount of power. When electrical equipment being powered by the lines begins to draw more power than the lines are designed to supply, the circuit breakers interrupt current flowing in the affected power lines, usually by energizing a circuit interrupter or trip element, to prevent damage to those lines. This effectively interrupts current flow to the electrical equipment so that the equipment cannot continue to draw excessive currents through the lines. However, the circuit breakers are designed in such a way that the power lines do not instantaneously fail when the dissipated power rises over the predetermined level. The lines, which are designed to operate continuously at the predetermined level, can transmit power above the predetermined level for a certain period of time which shortens as the power increases. The circuit breakers allow the line to transfer power for a period of time which is inversely proportional to the power on the line.

Current heats electrical conductors according to the following relationship:

$$T = I^2$$

where T is the temperature of the conductor and I is the current flowing in the conductor. The purpose of the voltage-to-frequency converter 10 is to monitor the current in the power line, and to provide an output proportional to the current on the line. Associated tripping circuitry, generally designated by reference numeral 11, receives the output, and interrupts the current in an overcurrent situation after an appropriate delay. If the input voltage is designated as Vin, the output frequency $fout$ of the voltage-to-frequency converter 10 is defined by the following relationship:

$$fout = K(Vin)^2$$

where K is a constant.

The correlation between the input and the output of the voltage-to-frequency converter 10 is similar to the correlation between the temperature of the conductor and the current flowing in it. This type of input/output relationship for the voltage-to-frequency converter 10 greatly simplifies the tripping circuitry for the circuit breaker, without complicating the circuitry of the voltage-to-frequency converter.

As illustrated in FIG. 1, the voltage-to-frequency converter 10 receives the input voltage Vin, and delivers the frequency signal having a frequency fout which is proportional to the input voltage Vin. The input voltage Vin appears on input lines 12,14 as a slowly fluctuating d.c. voltage, which changes transiently in response to fluctuations in the line current caused by increasing or decreasing power demands. The input voltage Vin is preferably received from a current transformer (not shown) which produces a signal proportional to the current in the conductor. The current signal is then converted to a voltage signal through a rectifier. As the power on the power lines increases above a predetermined level, the amount of time that the power lines can handle the power decreases. Since the output frequency fout is correlative to the current on the line, the frequency fout is monitored to determine when to trip the circuit breaker to interrupt the power line.

The voltage-to-frequency converter 10 uses two charging circuits 16,18 to produce the output signal having a frequency fout. The charging circuits 16,18 alternately charge and discharge in a complementary fashion to control respective portions $T_1, T_2$ (see FIGS. 2 and 3) of the period T of the output frequency fout. A set/reset flip flop 20 alternately switches each charging circuit 16,18 into the charge or discharge mode. The first charging circuit 16 includes an integrator 22, which receives the input voltage Vin on its non-inverting terminal. The integrator 22 produces an upwardly sloping output at node A, as represented by the sloping portion $T_1$ in FIG. 2A. The output of the integrator 22 is connected to a first comparator 24 which changes state when the output of the integrator 22 exceeds a voltage setpoint $V_1$. The output of the comparator 24 switches the "set" input of the set/reset flip flop 20. This causes the output of the flip flop 20 at node C to change states, as shown by the transition between the portion $T_1$ and the portion $T_2$ in FIG. 2C.

When the output of the flip flop 20 changes states, a current source 26, which is connected between the integrator 22 and the flip flop 20, begins to discharge the integrator 22. This discharge is depicted by the downwardly sloping portions $T_2$ of FIG. 2A. In addition, the transition of the output of the flip flop 20 causes the second charging circuit 18 to begin charging, while the first charging circuit 16 discharges, as shown by the portion $T_2$ in FIG. 2B. This is accomplished by a current source 28 which receives the input voltage Vin and which outputs a current having a magnitude correlative to the magnitude of the input voltage Vin. The output current charges a capacitor 30, which is connected to the non-inverting input of a second comparator 32. A reference voltage $V_2$ is supplied to the inverting input of the second comparator 32. When the voltage on the capacitor 30 exceeds the reference voltage $V_2$, the output of the second comparator 32 switches states to reset the output of the flip flop 20. This transition of the flip flop 20 turns off the current source 26 to allow the integrator 22 to recharge. The transition also closes a switch 34, which is connected between the capacitor 30 and circuit ground, to present a discharge path to circuit ground, so that the capacitor 30 discharges quickly. This discharge is shown by the sharp downward transition of the waveform in FIG. 2B.

The transitions of the output of the flip flop 20 produce an output frequency fout having a period T, which is composed of the portions $T_1$ and $T_2$. The input voltage Vin determines the charging rates for the two charging circuits 16,18, and thus the period T of the output of the flip flop 20. The charging time for each of the charging circuits 16,18 determines the time period of the respective portions $T_1, T_2$ of the output frequency fout, and the portions $T_1, T_2$ are correlative to one another due to the common input voltage Vin.

FIG. 3 illustrates waveforms similar to those of FIG. 2. The input voltage Vin which produces the waveforms of FIG. 3 is greater than the input voltage Vin which produces the waveforms of FIG. 2. A comparison between FIG. 2C and FIG. 3C shows that the greater input voltage Vin produces an output having higher frequency. The greater input voltage Vin charges the charging circuits 16,18 more rapidly, so that the flip flop 20 switches at a higher rate. Since the output of the first charging circuit 16 reaches the voltage setpoint $V_1$ in a shorter amount of time, the portion $T_1$ of the period T shortens. Likewise, the greater input voltage Vin causes the voltage controlled current source 28 to output a higher current which charges the capacitor 30 to the voltage setpoint $V_2$ in a shorter amount of time, thus causing the portion $T_2$ of the period to shorten. The overall effect of the faster charging times produces an output from the flip flop 20 having a shorter period T and higher frequency fout.

Returning to FIG. 1, the frequency signal from the flip flop 20 is received by a tripping circuit 11. The tripping circuit 11 may take a variety of forms, either analog or digital, to process the output signal fout. A preferred digital implementation of the tripping circuit 11 is shown in FIG. 1 and includes a resetable counter 36 which receives the output frequency signal. The counter 36 counts the pulses of the frequency signal and outputs a tripping signal to a relay powering circuit (not shown) when the count exceeds a tripping setpoint before the counter 36 resets. To reset the counter 36, a level detector 38 receives the input voltage Vin and controls the counter 36 responsive to the magnitude of the input voltage Vin. The application of a reset signal to the counter 36 causes the counter 36 to reset to a predetermined count (typically zero).

The level detector 38 activates the counter 36 when the input voltage Vin exceeds a predetermined setpoint, which typically corresponds to about 110% of the current rating of the conductor. While activated, the counter 36 counts the pulses from the output of the voltage-to-frequency converter 10, and acts as a delay device. If the input voltage Vin drops below the predetermined setpoint by a predetermined amount, which typically corresponds to about 105% of the current rating of the conductor, the level detector 38 deactivates the counter 36. However, if the input voltage continues to exceed the predetermined setpoint, the counter 36 eventually reaches a tripping setpoint, and outputs a tripping signal which triggers the energization of a relay to interrupt current flow in the conductor. The time that it takes the counter 36 to count to the tripping setpoint is the delay time. Since a higher frequency causes the counter 36 to count at a higher rate, the counter 36 reaches the tripping setpoint faster to provide a shorter delay time.

Figure 4:
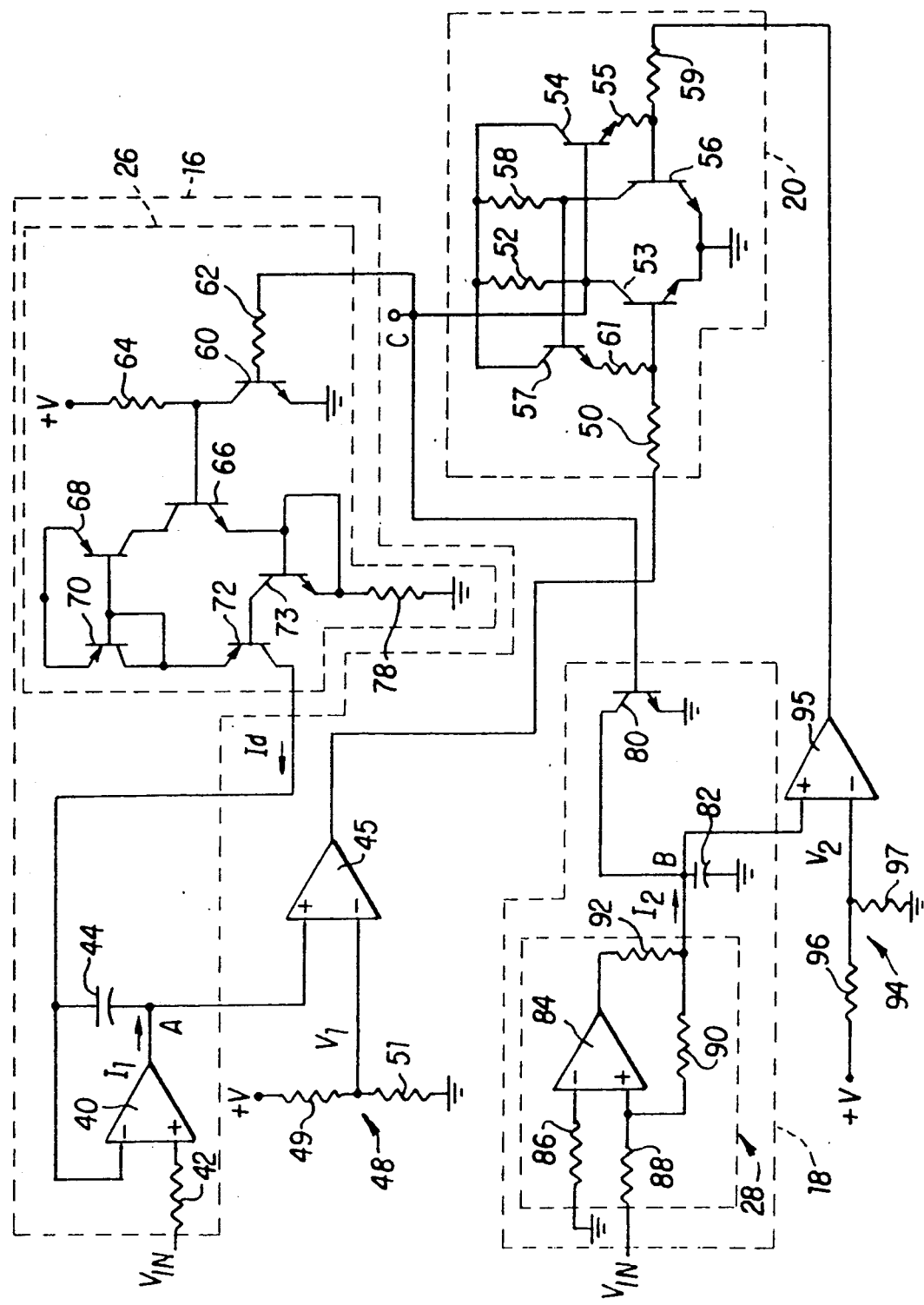
FIG. 4 is a schematic diagram of the voltage-to-frequency converter represented in FIG. 1.

A schematic diagram for a preferred embodiment of the voltage-to-frequency converter 10 is shown in FIG. 4. The input voltage Vin is received on the non-inverting input of an integrating operational amplifier 40 via a resistor 42. A capacitor 44 is provided in the negative feedback loop of the amplifier 40, and is charged at a rate dependent on the magnitude of the input voltage Vin. The non-inverting input of a comparator 45 receives the output of the integrating operational amplifier 40. The inverting input of the comparator 45 receives a threshold voltage $V_1$ from a voltage divider 48 formed by resistors 49 and 51. When the voltage across the capacitor 44 exceeds the voltage $V_1$, the comparator 45 outputs a "high" voltage (+5 to +15 volts) to the "set" input of the set/reset flip flop 20.

The "high" voltage from the comparator 45 is received at the base of a transistor 53 via a resistor 50, and causes the transistor 53 to saturate and conduct current. Current flowing through a resistor 52 from a positive voltage source +V to the collector of the transistor 53 causes the voltage at the collector, which is the output of the flip flop 20, to go to a "low" voltage (about 0.5 volts). The base of a transistor 54 is connected to the collector of the transistor 53, so it receives the "low" voltage signal and becomes non-conductive. When the transistor 54 is in a non-conductive state, the base of the transistor 56 goes to a "low" voltage because the emitter of the transistor 54 is connected thereto via a resistor 55. Thus, the transistor 56 becomes non-conductive also. The collector of the transistor 56 goes to a "high" voltage since there is no voltage drop across a resistor 58, which is connected between the collector of the transistor 56 and the positive voltage source +V.

The output of the flip flop 20 triggers both of the charging circuits 16 and 18. In the first charging circuit 16, the output alternately turns the current source 26 on and off to discharge and charge the capacitor 44, respectively. The voltage signal from the output of the flip flop 20 is received on the base of a transistor 60 via a resistor 62. When this signal is "low", it renders the transistor 60 non-conductive. In the non-conductive state, there is no voltage drop from the positive voltage source +V across a resistor 64, which is connected between the positive voltage source +V and the collector of the transistor 60. Therefore, the collector of the transistor 60 goes to a "high" voltage. The base of a transistor 66 is connected to the collector of the transistor 60, and receives this "high" voltage signal which renders the transistor 66 conductive.

Two transistors 68, 70 are connected in a current mirror arrangement with the collector of the transistor 68 being connected to the collector of the transistor 66. In this configuration, the conductive transistor 66 renders the transistors 68, 70 conductive also. A current Id flows to the capacitor 44 through the collector of a transistor 72 which has its emitter linked to the collector of transistor 70 and its base linked to the collector of a transistor 73. The base of transistor 73 is connected to the emitter of transistor 66 while its emitter is connected to ground through a resistor 78. The current Id is determined by the saturation characteristics of the transistors 66, 68 and the value of the resistor 78. The current Id is chosen to be greater than the charging current $I_1$ flowing to the capacitor 44 from the amplifier 40. The charging current $I_1$ is present as long as the input voltage Vin is present, hence, the discharging current Id must be greater than the charging current in order to discharge the capacitor 44. Since the charging current Id is substantially constant, the capacitor 44 discharges at a rate determined by the input voltage Vin for a period $T_2$ determined by the charging time of the second charging circuit 18.

While the first charging circuit 16 is discharging, the second charging circuit 18 charges. The second charging circuit 18 includes a charging element, shown here to be a capacitor 82 which is connected between ground and the collector of a transistor 80 which has its base connected to the output signal of flip flop 20 and its emitter grounded. The capacitor 82 is also connected to the voltage controlled current source 28, which comprises a non-inverting operational amplifier 84 and resistors 86, 88, 90, and 92. The resistor 86 connects the inverting input of the operational amplifier 84 to circuit ground, while the resistors 90, 92 are disposed in the feedback loop of the operational amplifier 84. The operational amplifier 84 receives the input voltage Vin on its non-inverting input via the resistor 88. The resistors 86, 88, 90, and 92 merely serve to scale the output current $I_2$ relative to the input voltage Vin, and the resistance values of these resistors are selected to partially adjust the magnitude of the output current $I_2$. When the output of the flip flop 20 is "low", it renders the transistor 80 nonconductive to prevent the capacitor 82 from discharging to circuit ground through the transistor 80. Since there is no path to ground, the current source 28 charges the capacitor 82 with a current $I_2$.

In FIG. 4, the output of the capacitor 82 is connected to the non-inverting input of an operational amplifier 95, which is supplied with a reference voltage $V_2$ on its inverting terminal by a voltage divider 94 made up of resistors 96, 97. The output of the amplifier 95 is connected through a resistor 59 to the "reset" input of the flip flop 20 as defined by the junction of the base of transistor 56 and the resistor 55 leading to the emitter of transistor 54. When the voltage across the capacitor 82 exceeds the reference voltage $V_2$, the comparator 95 outputs a positive voltage to the "reset" input of flip flop 20. The positive voltage signal renders the transistor 56 conductive, thus causing its collector to go to a "low" voltage. The collector of transistor 56 is connected to the base of a transistor 57 which has its collector linked to the collector of transistor 54 and its emitter linked to the base of transistor 53 through a resistor 61. The "low" voltage signal at the collector of transistor 56 thus renders the transistor 57 nonconductive. This in turn causes the base of transistor 53 to go "low" and renders the transistor 53 nonconductive. This causes the collector of the transistor 53 to go "high" and closes the path to ground for the capacitor 82. The "high" output of the transistor 53 also turns "off" the current source 26 so that the current $I_1$ once again charges the capacitor 44.

The following is a brief mathematical description illustrating the relationship between the input voltage and the output frequency for the voltage-to-frequency converter 10 of FIGS. 1 and 4. It should be noted that the change $\Delta V$ in the voltage at the output of the integrator 40 changes as a function of the input voltage Vin (see FIGS. 2 and 3).

The period $T_1$ is defined by the following equation:

$$T1 = \frac{(\Delta V)(C1)}{I1} \tag{1}$$

The period $T_2$ is defined by the following equation:

$$T2 = \frac{(C2)(V2)}{I2} \quad (2)$$

In equations (1) and (2), $C_1$ is the capacitance of capacitor 44, $C_2$ is the capacitance of capacitor 82, $V_1$ and $V_2$ are the reference voltages mentioned earlier, and $I_1$ and $I_2$ are the charging currents for the capacitors 44 and 82, respectively.

$\Delta V$ is defined by the following equation:

$$\Delta V = \frac{(Id - I1)T2}{C1} \quad (3)$$

where Id is the discharge current from the current source 26.

Using equation (3), and substituting values defined therein into equations (1) and (2), the period T is defined by the following equation:

$$T = T1 + T2 = \frac{(Id)(C2)(V2)}{(I1)(I2)} - \frac{(I1)(C2)}{I2} + \frac{(I1)(C2)}{I2} \quad (4)$$

The values of the currents $I_1$ and $I_2$ can be defined as $I_1=(K_1)(Vin)$ and $I_2=(K_2)(Vin)$, where $K_1$ and $K_2$ are constants. Thus, the total period T can be defined as:

$$T = \frac{(Id)(V2)(C2)}{(K1)(K2)(Vin)^2} \quad (5)$$

Therefore, the output frequency $f$out can be defined as:

$$f\text{out} = 1/T = \frac{(K1)(K2)(Vin)^2}{(Id)(V2)(C2)} \quad (6)$$

It will be apparent from equation (6) that the output frequency $f$out is proportional to the square of the current in the conductor since the input voltage Vin is correlative to the current in the conductor.

What is claimed is:

1. A voltage-to-frequency converter for use in a circuit interrupter which protects a conductor from excessive current, comprising:
    means producing a signal correlative to the current flowing in said conductor;
    means for delivering a frequency signal having a frequency correlative to the square of the magnitude of said produced signal, wherein said delivering means includes:
    first means altering a first portion of the period of said frequency signal in response to the magnitude of said produced signal, said first means comprises am integrator which charges to a first preselected setpoint at a rate responsive to the magnitude of said produced signal, whereby the charging time determines the duration of said first portion of the period of said frequency signal; and
    second means altering a second portion of the period of said frequency signal in response to the magnitude of said produced signal said second means comprises a current source which charges a storage element to a second preselected setpoint at a rate responsive to the magnitude of said produced signal, whereby the charging time determines the duration of said second portion of the period of said frequency signal;
    said first means further comprises a current source which discharges said integrator at a substantially constant rate; and
    said second means further comprises a discharge path having a switch to render said discharge path conductive when said switch is in a closed position, and nonconductive when said switch is in an open position.

2. The voltage-to-frequency converter, as set forth in claim 1, wherein said current source in said first means begins to discharge said integrator when said integrator reaches said first preselected setpoint.

3. The voltage-to-frequency converter, as set forth in claim 1, wherein said discharge path begins to discharge said storage element when the charge on said storage element reaches said second preselected setpoint.

4. The voltage-to-frequency converter, as set forth in claim 1, wherein said integrator charges while said storage element discharges, and said storage element charges while said integrator discharges.

5. A voltage-to-frequency converter for use in a circuit interrupter which protects a conductor from excessive current, comprising:
    means for producing a signal correlative to the current flow in said conductor;
    first means for charging to a first preselected voltage in response to the magnitude of the correlative signal produced by said producing means (the "produced" signal);
    second means for charging to a second preselected voltage in response to the magnitude of said produced signal;
    means for discharging said first means while said second means charges to said second preselected voltage;
    means for discharging said second means while said first means charges to said first preselected voltage; and
    means for delivering a positive voltage pulse while said first means charges, and for delivering a negative voltage pulse while said second means charges with said positive and negative pulses representing a frequency signal having a frequency correlative to the square of the magnitude of said conductor current.

6. The voltage-to-frequency converter, as set forth in claim 5, wherein said first means includes:
    an integrator which charges to said first preselected voltage at a rate responsive to the magnitude of said produced signal, whereby the charging time determines the duration of said positively going pulse.

7. The voltage-to-frequency convertor, as set forth in claim 6, wherein:
    said means for discharging said first means includes a current source which discharges said integrator at a substantially constant rate.

8. The voltage-to-frequency converter, as set forth in claim 5, wherein said second means includes:
    a current source which charge a storage element to said second preselected voltage at a rate responsive to the magnitude of said produced signal, whereby the charging time determines the duration of said negatively going pulse.

9. The voltage-to-frequency convertor, as set forth in claim 8, wherein:

said means for discharging said second means includes a discharge path having a switch to render said discharge path conductive and nonconductive.

10. The voltage-to-frequency converter, as set forth in claim 5, wherein aid first means delivers a set signal in response to charging to said first preselected voltage.

11. The voltage-to-frequency converter, as set forth in claim 10, wherein said second means delivers a reset signal in response to charging to said preselected voltage.

12. The voltage-to-frequency converter, as set forth in claim 11, wherein aid pulse delivering means includes a flip flop which receives said set and reset signals and delivers a positively going pulse in response to one of said received signals and a negatively going pulse in response to the other of said signals.

13. A voltage-to-frequency converter for use in a circuit interrupter which protects a conductor from excessive current, comprising:
    means producing a signal correlative to the current flowing in said conductor;
    an integrator having a first storage element which is charged by the correlative signal produced by said producing means (the "produced" signal), said integrator delivering a first voltage signal responsive to the magnitude of the charge on said first storage element;
    a current source which delivers a current signal responsive to the magnitude of said produced signal;
    a second storage element which is charged by said current signal, and delivers a second voltage signal responsive to the magnitude of the charge on said second storage element;
    a first comparator which compares said first voltage signal to a first preselected setpoint, and delivers a set signal to said first voltage signal exceeding said first preselected setpoint;
    a second comparator which compares said second voltage signal to a second preselected setpoint, and delivers a reset signal in response to said second voltage signal exceeding said second preselected setpoint;
    a flip flop which receives said set and reset signals and produces a control signal in response to one of said received signals and removes said control signal in response to the other of said received signals, said control signal being of a frequency which varies proportionally to the square of said produced signal;
    a switch connected between said second storage element and a discharge path, said switching opening in response to said set signal and closing in response to said reset signal; and
    a second current source connected to said first storage element, wherein said second current source delivers a discharging current to said first storage element in response to sid set signal and terminates said discharging current in response to said reset signal.

14. A system for protecting an electrical conductor from excessive current, comprising:
    means for producing a signal correlative to the current flow in said conductor;
    first means for charging to a first preselected voltage in response to the magnitude of the correlative signal produced by said producing means (the "produced" signal);
    second means for charging to a second preselected voltage in response to the magnitude of said produced signal;
    means for discharging said first means while said second means charges to said second preselected voltage;
    means for discharging said second means while said first means charges to said first preselected voltage;
    means for delivering a positive voltage pulse while said first means charges, and for delivering a negative voltage pulse while said second means charges with said positive and negative pulses representing a frequency signal having a frequency correlative to the square of the magnitude of said conductor current;
    means for counting individual pulses of said frequency signal and delivering a tripping signal in response to said count exceeding a predetermined count; and
    means for open circuiting said conductor in response to said tripping signal.

15. The system, as set forth in claim 14, wherein said first means includes:
    an integrator which charges to said first preselected voltage at a rate responsive to the magnitude of said produced signal, whereby the charging time determines the duration of said positively going pulse.

16. The system, as set forth in claim 15, wherein:
    said means for discharging said first means includes a current source which discharges said integrator at a substantially constant rate.

17. The system, as set forth in claim 14, wherein said second means includes:
    a current source which charges a storage element to said second preselected voltage at a rate responsive to the magnitude of said produced signal, whereby the charging time determines the duration of said negatively going pulse.

18. The system, as set forth in claim 17, wherein:
    said means for discharging said second means includes a discharge path having a switch to render said discharge path conductive and nonconductive.

19. The system, as set forth in claim 14, wherein said first means delivers a set signal in response to charging to said first preselected voltage.

20. The system, as set forth in claim 19, wherein said second means delivers a reset signal in response to charging to said second preselected voltage.

21. The system, as set forth in claim 20, wherein said pulse delivering means includes a flip flop which receives said set and reset signals and delivers a positively going pulse in response to one of said received signals and a negatively going pulse in response to the other of said signals.

22. The system, as set forth in claim 14, wherein said counting means includes:
    a level detector which delivers a starting signal in response to said produced signal exceeding a predetermined magnitude, and which delivers an ending signal otherwise; and
    a counter which begins to count individual pulses of said frequency signal in response to receiving said starting signal, and resets in response to receiving said ending signal.

23. The system, as set forth in claim 14, wherein said open circuiting means includes an electromagnetic relay.

24. A system for protecting an electrical conductor from excessive current, comprising:
    means producing a signal correlative to the current flowing in said conductor;
    an integrator having a first storage element which is charged by the correlative signal produced by said producing means (the "produced" signal), said integrator delivering a first voltage signal responsive to the magnitude of the charge on said first storage element;
    a current source which delivers a current signal responsive to the magnitude of said produced signal;
    a second storage element which is charged by said current signal, and delivers a second voltage signal responsive to the magnitude of the charge on said second storage element;
    a first comparator which compares said first voltage signal to a first preselected setpoint, and delivers a set signal to said first voltage signal exceeding said first preselected setpoint;
    a second comparator which compares said second voltage signal to a second preselected setpoint, and delivers a reset signal in response to said second voltage signal exceeding said second preselected setpoint;
    a flip flop which receives said set and reset signals and produces a control signal in response to one of said received signals and removes said control signal in response to the other of said received signals, said control signal being of a frequency which varies proportionally with the square of said produced signal;
    a switch connected between said second storage element and a discharge path, said switching opening in response to said set signal and closing in response to said reset signal;
    a second current source connected to said first storage element, wherein said second current source delivers a discharging current to said first storage element in response to sid set signal and terminates said discharging current in response to said reset signal;
    a level detector which receives said produced signal, delivers a starting signal in response to said produced signal being greater than a first predetermined magnitude, and delivers an ending signal in response to aid produced signal being less than a second predetermined magnitude; and
    a counter for counting pulses of said control signal in response to receiving said starting signal, and delivering a tripping signal in response to said count being greater than a preselected count, and wherein said counter resets in response to receiving said ending signal.

25. A voltage-to-frequency converter for use in a circuit interrupter which protects a conductor from excessive current, comprising:
    means producing a signal correlative to the current flowing in said conductor;
    means for delivering a frequency signal having a frequency correlative to the square of the magnitude of the correlative signal produced by said producing means (the "produced" signal), wherein said delivering means includes:
    first means altering a first portion of the period of said frequency signal in response to the magnitude of said produced signal, said first means comprising an integrator which charges to a first preselected setpoint at a rate responsive to the magnitude of said produced signal, whereby the charging time determines the duration of said first portion of the period of said frequency signal; and
    second means altering a second portion of the period of said frequency signal in response to the magnitude of said produced signal, said second means comprising a current source which charges a storage element to a second preselected setpoint at a rate responsive to the magnitude of said produced signal, whereby the charging time determines the duration of said second portion of the period of said frequency signal.

* * * * *